United States Patent [19]
You

[11] Patent Number: 5,986,956
[45] Date of Patent: Nov. 16, 1999

[54] REPAIR CONTROL CIRCUIT

[75] Inventor: Min-Young You, Cheongju, Rep. of Korea

[73] Assignee: LG Semicon Co., Ltd., Choongcheongbuk-do, Rep. of Korea

[21] Appl. No.: 09/198,521

[22] Filed: Nov. 24, 1998

[30] Foreign Application Priority Data

Dec. 27, 1997 [KR] Rep. of Korea ..................... 97-75305

[51] Int. Cl.⁶ ................................. G11C 7/00
[52] U.S. Cl. ............... 365/207; 365/189.02; 365/200
[58] Field of Search ................... 365/207, 208, 365/205, 189.02, 200, 225.7

[56] References Cited

U.S. PATENT DOCUMENTS

| | | | |
|---|---|---|---|
| 5,438,546 | 8/1995 | Ishac et al. | 365/200 |
| 5,455,798 | 10/1995 | McClure | 365/200 |
| 5,497,347 | 3/1996 | Feng | 365/189.02 |

Primary Examiner—Tan T. Nguyen

[57] ABSTRACT

A repair control circuit for decreasing the driving current, fuse-cutting time and chip size by disabling a main sense amplifier without having to blow a fuse to reduce the driving current, the repair control circuit including: a column coding controller for outputting a column coding signal, a block repair controller for outputting a block repair signal, an input/output repair control signal for receiving the column coding signal and the clock repair signal and outputting a main sense amplifier disable signal, an input/output repair control signal, an input/output enable signal and a repair sense amplifier enable signal; a main sense amplifier for receiving data from a data bus and amplifying the same in accordance with a control of the main sense amplifier disable signal and the sense amplifier enable signal; a repair sense amplifier for receiving data, which is to be repaired, from the data bus and amplifying the same in accordance with a control of the input/output repair control signal, the repair sense amplifier enable signal and the sense amplifier enable signal from the input/output repair controller; and a multiplexer for selectively outputting the amplified data from the main sense amplifier and the repair sense amplifier.

8 Claims, 8 Drawing Sheets

FIG.7A BACKGROUND ART  RB
FIG.7B BACKGROUND ART  RECOL
FIG.7C BACKGROUND ART  IOEN
FIG.7D BACKGROUND ART  SAEN
FIG.7E BACKGROUND ART  MSADIS        LOW
FIG.7F BACKGROUND ART  RDO
FIG.7G BACKGROUND ART  DOUT

FIG.13B RECOL

FIG.13C IOEN

FIG.13D MSADIS

FIG.13E RSAENS

FIG.13F SAEN

FIG.13G RDO

FIG.13H DOUT 5,986,956

REPAIR CONTROL CIRCUIT

BACKGROUND OF THE INVENTION

1. Field of the Invention

The present invention relates to a repair control circuit, and in particular to an improved repair control circuit which is capable of reducing a fuse cutting time and a chip size by reducing the number of fuses when a sense amplifier having a repair function is operated.

2. Description of the Background Art

Figure 1:
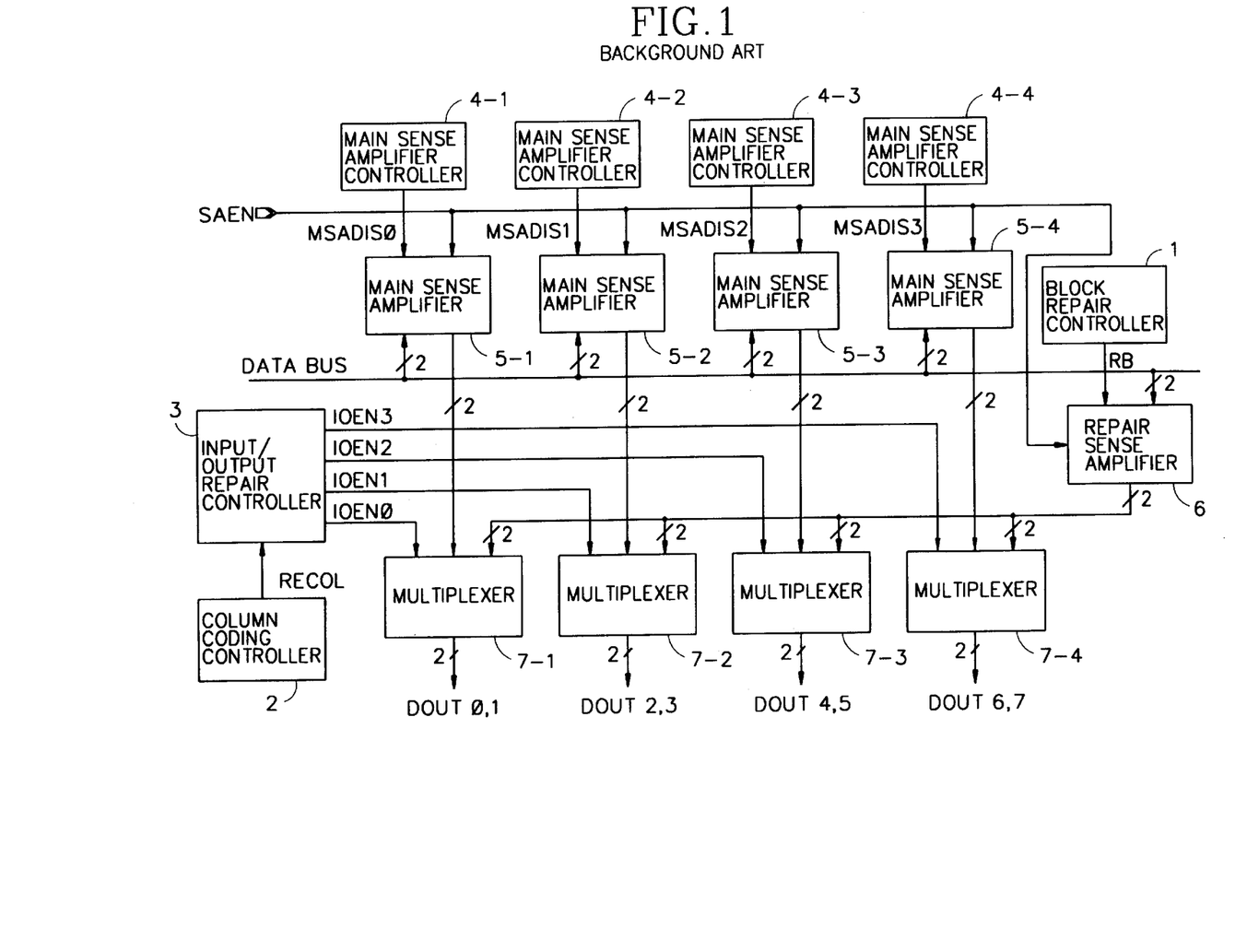
FIG. 1 is a block diagram illustrating a known repair control circuit.

As shown in FIG. 1, a known repair control circuit includes a block repair controller 1 for outputting a block repair control signal RB, a column coding controller 2 for outputting a column coding signal RECOL, an input/output repair controller 3 for receiving the column coding signal RECOL and outputting an input/output enable signals IOEN$_j$, where j=0 to 3, main sense amplifier controllers 40-i, where i=1 to 4, for outputting main sense amplifier disable signals MSADIS$_j$, where j=0 to 3, main sense amplifiers 5-i, where i=1 to 4, for receiving data from a data bus and amplifying the same in accordance with a main sense amplifier disable signal and a sense amplifier enable signal SAEN, a repair sense amplifier 6 for receiving data from the data bus and amplifying the same in accordance with a block repair control signal RB and a sense amplifier enable signal SAEN, and a multiplexer 7 for selectively outputting data from the main sense amplifiers 5-i and the repair sense amplifier 6.

Figure 2:
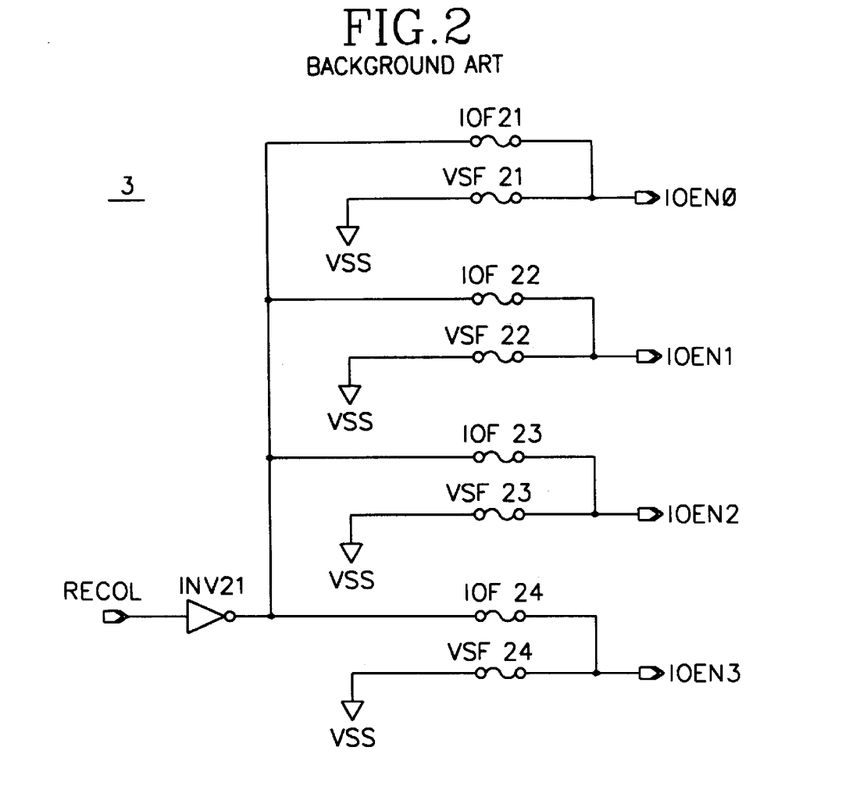
FIG. 2 is a detailed circuit diagram illustrating an input/output repair controller of the circuit of FIG. 1.

Here, as shown in FIG. 2, the input/output controller 3 includes an inverter INV21 for inverting a column coding signal RECOL, a plurality of input/output fuses IOF21 through IOF24 for blocking the output signal from the inverter INV21, and a plurality of ground voltage fuses VSF21~VSF24 connected with a ground voltage VSS and the input/output fuses IOF21~IOF24.

Figure 3:
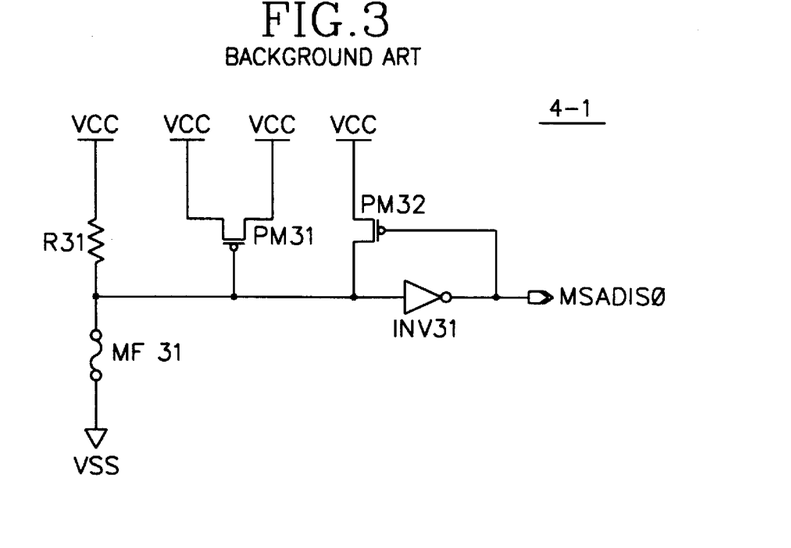
FIG. 3 is a detailed circuit diagram illustrating a main sense amplifier controller of the circuit of FIG. 1.

As shown in FIG. 3, an example main sense amplifier controller 4 includes: a resistor R31 and a main sense amplifier fuse MF31 connected in series between an external voltage VCC and a ground voltage VSS; an inverter INV31, one input terminal of which is commonly connected with the resistor R31 and the main sense amplifier fuse MF31 for outputting a main sense amplifier disable signal MSADIS0; a PMOS transistor PM31, the drain and source of which receive an external voltage VCC, and the gate of which is commonly connected with the resistor R31 and the main sense amplifier fuse MF; and a PMOS transistor PM32, the source of which receives an external voltage VCC, the gate of which receives an output signal from the inverter INV31, and the drain of which is commonly connected with the resistor R31 and the main sense amplifier fuse MF31.

Figure 4:
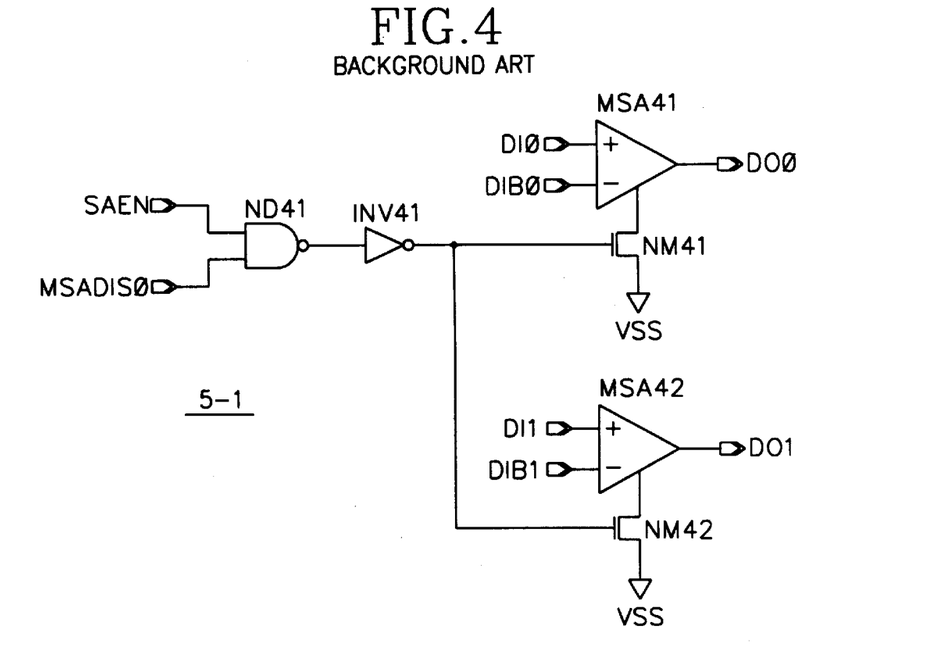
FIG. 4 is a detailed circuit diagram illustrating a main sense amplifier of the circuit of FIG. 1.

As shown in FIG. 4, an example main sense amplifier 5-L includes: a NAND-gate ND41 for receiving the main sense amplifier disable signal MSADIS0 and the sense amplifier enable signal SAEN; an inverter INV41 for inverting the output signal from the NAND-gate ND41; NMOS transistors NM41 and NM42, the gates of which receive the output signal from the inverter INV41, and the sources of which are connected with the ground voltage VSS; and main sense amplifiers MSA41 and MSA42 for receiving data DI0, DIB0, DI1 and DIB1 from the data bus in accordance with the control of the drains of the NMOS transistors NM41 and NM42 and amplifying the thusly received data and outputting main sense amplifier output data DO0 and DO1.

Figure 5:
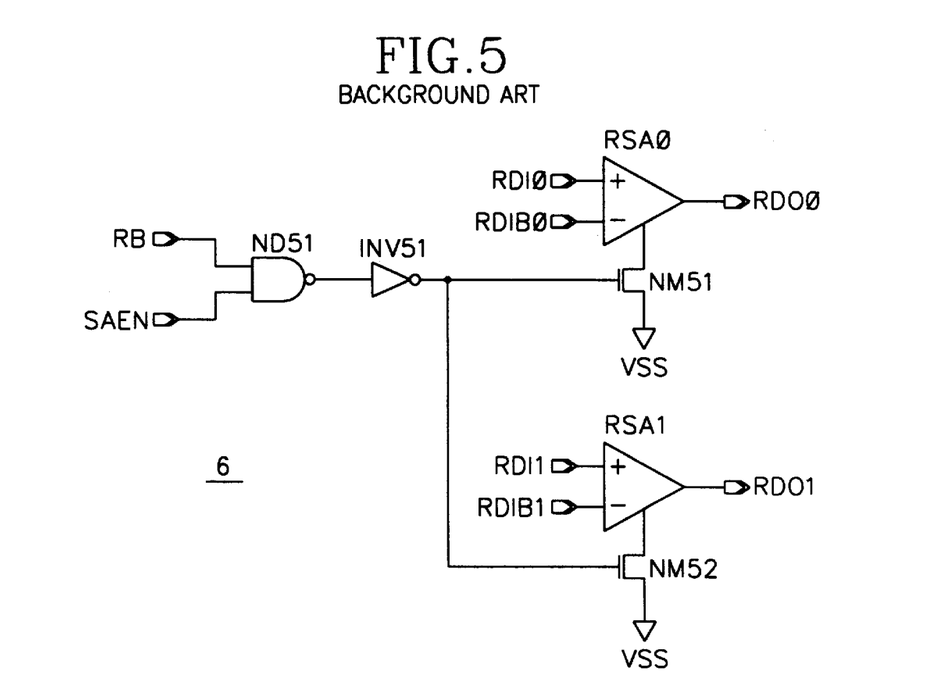
FIG. 5 is a detailed circuit diagram illustrating a repair sense amplifier of the circuit of FIG. 1.

As shown in FIG. 5, the repair sense amplifier 6 includes: a NAND-gate ND51 for receiving a block repair control signal RB and a sense amplifier enable signal SAEN; an inverter INV51 for inverting an output signal from the NAND-gate ND51; NMOS transistors NM51 and NM52, the gates of which receive an output signal from the inverter INV51 and the source of which is connected with a ground voltage VSS; and main sense amplifiers RSA0 and RSA1 controlled by the drains of the NMOS transistors NM51 and NM52 for amplifying the data RDI0, RDIB0, RDI1 and RDIB1 inputted through the data bus and amplifying the same and outputting main sense amplifiers RSA51 and RSA52.

Figure 6:
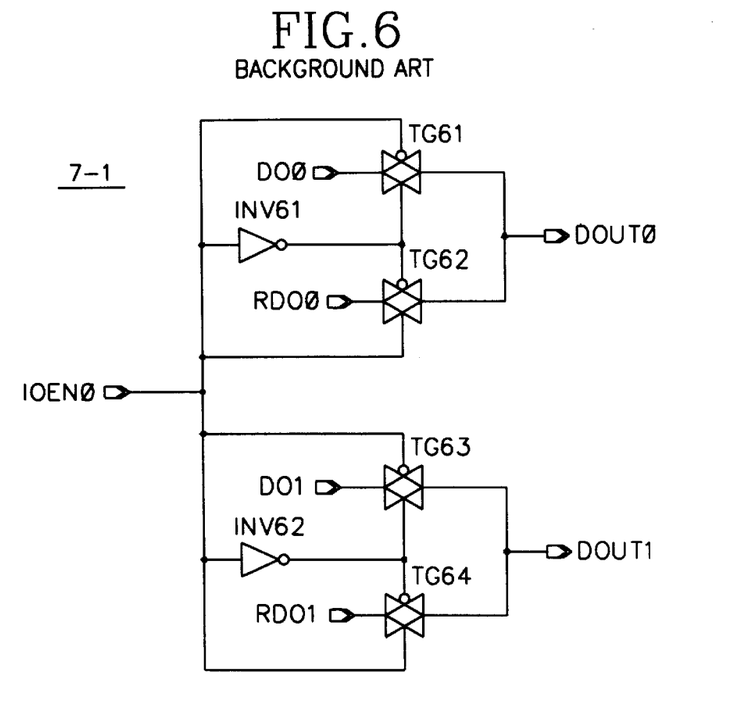
FIG. 6 is a detailed circuit diagram illustrating a multiplexer of the circuit of FIG. 1.

As shown in FIG. 6, an example output multiplexer 7 includes: inverters INV61 and INV62 for inverting the input/output repair control signal IOEN0; and transmission gates TG61 and TG62 controlled in accordance with the input/output repair control signal IOEN0 and the inverter signal for transmitting the main sense amplifier output data DO0 and DO1 and the repair sense amplifier output data RDO0 and RDO1 and selectively outputting the output data DOUT0 and DOUT1.

The operation of the known input/output repair control circuit will now be explained with reference to the accompanying drawings.

Figure 7A:
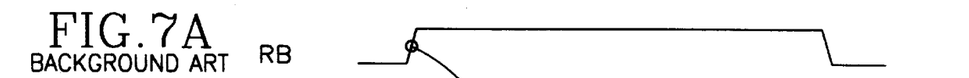
FIGS. 7A through 7G are waveform diagrams illustrating operational timing of the circuit of FIG. 1.

First, the block repair controller 1 cuts the block fuse with respect to the cell to be repaired and outputs a low output signal. As a result of the block coding, as shown in FIG. 7A, a high level enable signal is outputted to the block repair signal RB.

Figure 7B:
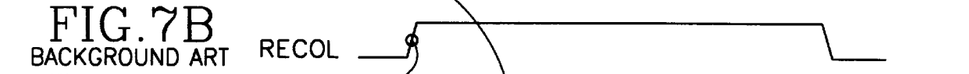
Figure 7C:
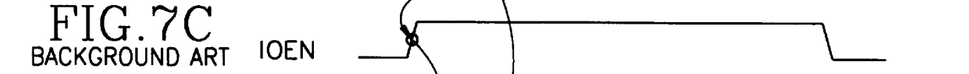

At this time, the input/output repair controller 3 cuts the input/output fuse with respect to the cell to be repaired, and the repair column signal RECOL which is a column signal of the cell to be repaired (as shown in FIG. 7B) is outputted as a high level input/output enable signal IOEN as shown in FIG. 7C. If there is not cell to be repaired, the input/output repair control signal IOEN cuts the ground voltage fuse VSF, and a low level input/output enable signal IOEN is outputted.

Figure 7D:
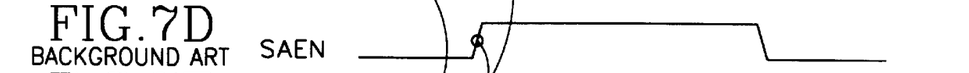
Figure 7E:
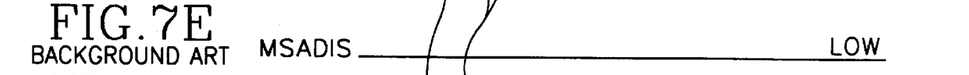

In addition, the main sense amplifier controller 4 cuts a main sense amplifier fuse MF neighboring with the main sense amplifier with respect to the input/output corresponding with the cell to be repaired, and the main sense amplifier disable signal MSADIS as shown in FIG. 7E becomes a low level, so that the main sense amplifiers MSA41 and MSA42 of the main sense amplifier 5 is disabled.

If there is a cell to be repaired, the main sense amplifier disable signal MSADIS becomes a low level, and the NMOS transistors NM41 and NM42 are turned off, so that the main sense amplifiers MSA41 and MSA42 are disabled. In addition, the repair sense amplifiers RSA51 and RSA52 of the repair sense amplifier 6 are enabled by the repair block signal RB and the sense amplifier enable signal SAEN as shown in FIG. 7D.

Figure 7F:
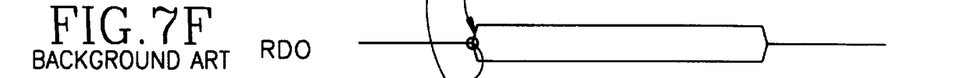
Figure 7G:
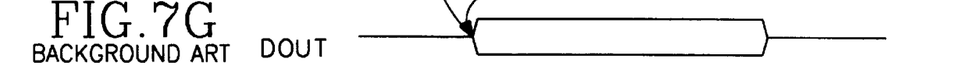

Therefore, if there is a cell to be repaired, the input/output repair control signal, e.g., IOEN0 which is an output signal from the input/output repair controller 3 becomes a high level, and the transmission gates TG61 and TG63 of the multiplxer 7-1 transmitting the output signals DO0 and DO1 from the main sense amplifiers MSA41 and MSA42 are turned off, and the output signals DO0 and DO1 from the main sense amplifiers MSA41 and MSA42 are not outputted. The transmission gates TG62 and TG64 of the multiplxer 7-1 transmitting the output signals RDO0 and RDO1 from the repair sense amplifiers RSA0 and RSA1 are turned on. As shown in FIGS. 7F and 7G, the output signals RDO0 and RDO1 from the repair sense amplifiers RSA51 and RSA52 are outputted as output data DOUT0 and DOUT1.

Generally, when the repair sense amplifier is operated in order to output the input/output data repaired by the repaired chip, the repair sense amplifier and the main sense amplifier are all operated, so that the driving current of the chip is increased.

Therefore, in order to reduce the above-described driving current, since the fuses disabling the main sense amplifier should be used for every main sense amplifiers, the number of the fuses is increased, so that the size of the main chip is increased, and the repairing time is increased.

SUMMARY OF THE INVENTION

Accordingly, it is an object of the present invention to provide a repair control circuit which overcomes the aforementioned problems encountered in the background art.

It is another object of the present invention to provide a repair control circuit which is capable of decreasing the driving current, fuse cutting time and chip size by disabling a main sense amplifier without having to blow a fuse to reduce the driving current.

To achieve the above and other objects, there is provided a repair control circuit which includes a repair control circuit comprising: a column coding controller for outputting a column coding signal; a block repair controller for outputting a block repair signal; a plurality of input/output repair controllers for receiving the column coding signal and the block repair signal and outputting main sense amplifier disable signals, input/output repair control signals, input/output enable signals and a repair sense amplifier enable signals; a plurality of main sense amplifiers, corresponding in number to said plurality of repair controllers, for receiving and amplifying data from a data bus in accordance with the main sense amplifier disable signals and the sense amplifier enable signals, respectively; a repair sense amplifier for receiving and amplifying data, which is to be repaired, from the data bus in accordance with an input/output repair control signal, the repair sense amplifier enable signals and a sense amplifier enable signal; and a plurality of multiplexers, corresponding in number to said plurality of main sense amplifiers, for selectively outputting the amplified data from the main sense amplifier and the repair sense amplifier.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 8:
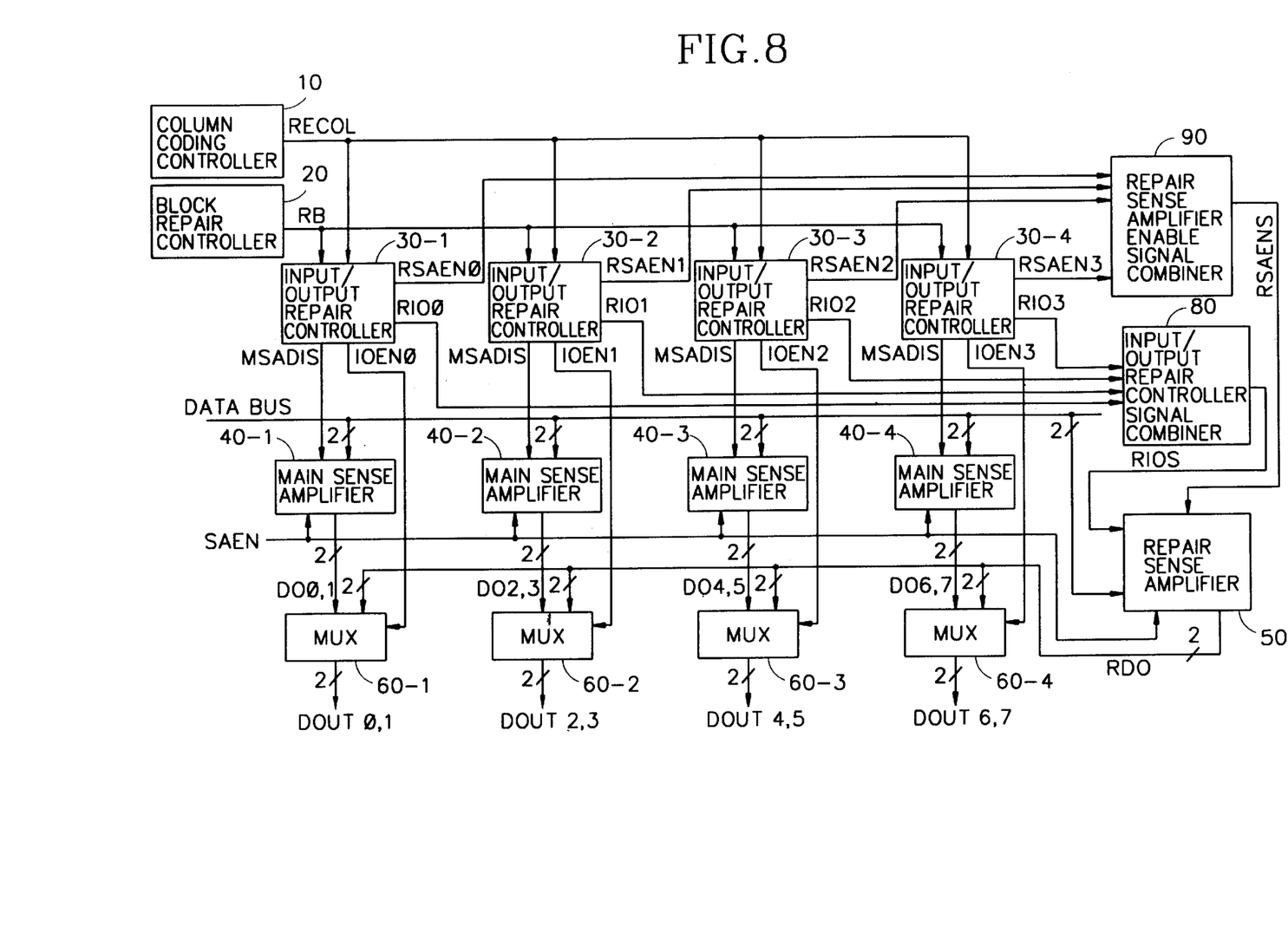
FIG. 8 is a block diagram illustrating a repair control circuit according to the present invention.

As shown in FIG. 8, the input/output repair circuit according to the present invention includes a column coding controller 10 for outputting a column coding signal RECOL, a block repair controller 20 for outputting a block repair signal RB, input/output repair controller 30-j, where j=1 to 4, for receiving the column coding signal RECOL and the block repair signal RB and outputting a main sense amplifier disable signal MSADIS, input/output repair control signals RIOi, where i=0 to 3, input/output enable signals IOENi, where i=0 to 3 and repair sense amplifier enable signals RSAENi, where i=0 to 3 main sense amplifiers 40-j, where j–1 to 4 for receiving data from a data bus and amplifying the same in accordance with a control of the main sense amplifier disable signal MSADIS, a repair input/output control signal combiner 80 for combining the repair input/output control signals RIOi, where i=0 to 3 from the input/output repair controllers 30-j, where j=1 to 4, a repair sense amplifier combiner 90 for combining the repair sense amplifier enable signals RSAENi from the input/output repair controller 30, a repair sense amplifier 50 for receiving a data, which is to be repaired, from the data bus in accordance with the output signals from the repair input/output combiner 80 and the repair sense amplifier enable signal 90, and a multiplexers 60-j, where j=1 to 4, for selectively outputting the data from the main sense amplifiers 40-j and the repair sense amplifier 50.

Figure 9:
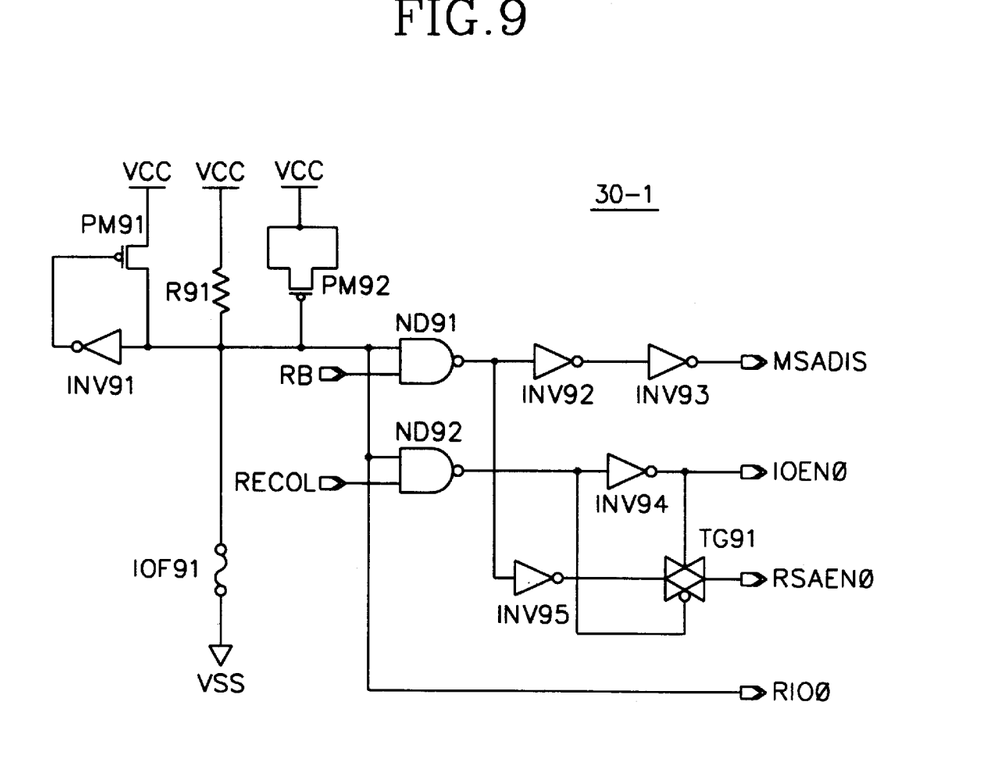
FIG. 9 is a detailed circuit diagram illustrating an input/output repair controller of the circuit of FIG. 8.

Here, as shown in FIG. 9, an example input/output repair controller 30-1 includes: a PMOS transistor PM91, the source of which receives an external voltage VCC; an inverter INV91, an input terminal of which is connected with the drain of the PMOS transistor PM91 and an output terminal of which is connected with the gate of the same; a PMOS transistor PM92, the source and drain of which are commonly connected with an external voltage VCC, and the gate of which is connected with an input terminal of the inverter INV91; a resistor R91 and an input/output fuse IOF91 connected between the external voltage VCC and the ground; a NAND-gate ND91 for receiving the block repair signal RB and the input/output cutting signal RIO; inverters INV92 and INV93 for sequentially inverting the output signal from the NAND-gate ND91; an inverter INV95 for inverting an output signal from the NAND-gate ND91; a NAND-gate ND92 for receiving the input/output cutting signal RIO0 and the column coding signal RECOL; an inverter INV94 for inverting an output signal from the NAND-gate ND92; and a transmission gate TG92 transmitting the output signal from the inverter INV95 in accordance with an output signal from the inverter INV94.

Figure 10:
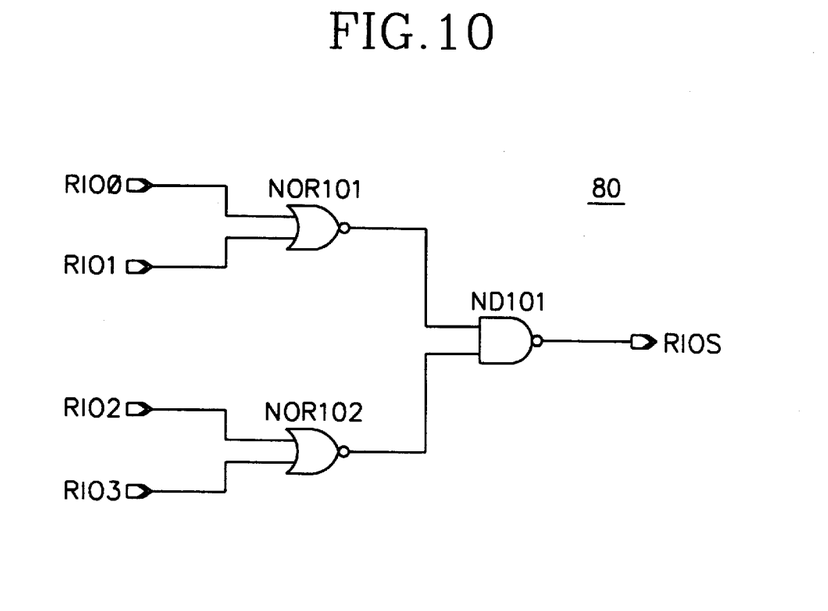
FIG. 10 is a detailed circuit diagram illustrating an input/output repair control signal combiner of the circuit of FIG. 8.

As shown in FIG. 10, the repair input/output controller 80 includes NOR-gates NOR101 and NOR102 for combining the repair input/output control signals RIO0~RIO3 from the input/output repair controllers 30-j and a NAND-gate ND101 for outputting a repair input/output control signal RIOS that the output signals from the NOR-gates NOR101 and NOR102 are inputted and combined.

Figure 11:
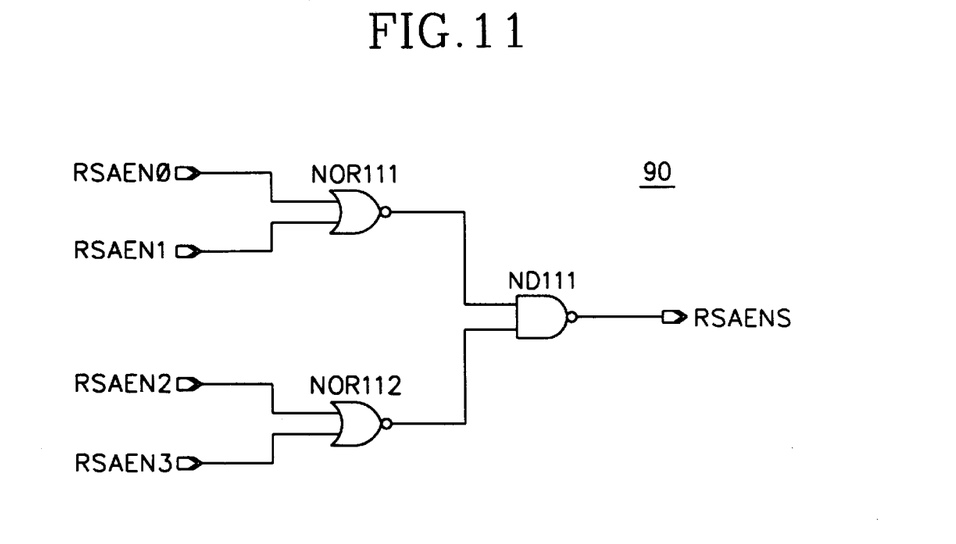
FIG. 11 is a detailed circuit diagram illustrating a repair sense amplifier enabling signal combiner of the circuit of FIG. 8.

As shown in FIG. 11, the repair sense amplifier controller 90 includes NOR-gates NOR111 and NOR112 for combining the repair sense amplifier enable signals RSAEN0~RSAEN3 from the input/output repair controllers 30-j, and a NAND-gate ND111 for receiving the output signals from the NOR-gates NOR111 and NOR112 and outputting a repair sense amplifier enable combining signal RSAENS.

Figure 12:
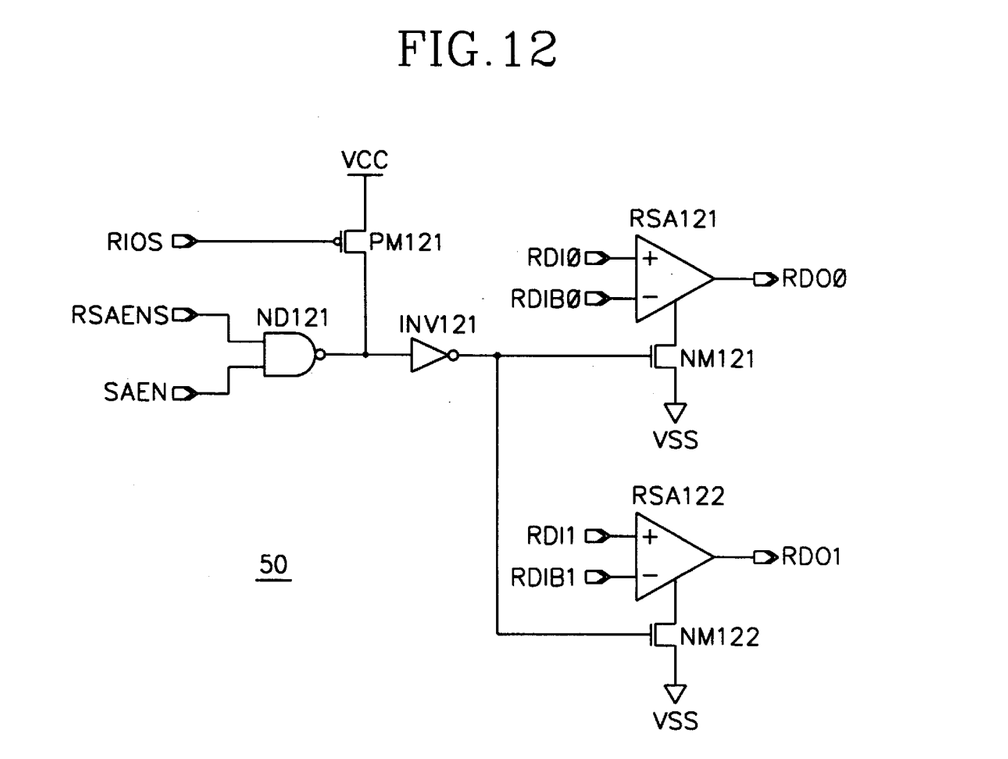
FIG. 12 is a detailed circuit diagram illustrating a repair sense amplifier of the circuit of FIG. 8.

As shown in FIG. 12, the repair sense amplifier 50 includes: a NAND-gate ND121 for receiving a repair sense amplifier enable signal RSAEN and a sense amplifier enable signal SAEN; an inverter INV121 for inverting an output signal from the NAND-gate ND121; a PMOS transistor PM121, the gate of which receives a combined repair input/output control signal RIOS (which is an output signal from the repair input/output controller 30-j), the drain of which receives an external voltage VCC, and the source of which is connected with the output terminal of the NAND-gate ND121; NMOS transistors NM121 and NM122, the gates of which receive the output signal from the inverter INV121, and the sources of which are connected with the ground voltage VSS; and repair sense amplifiers RSA121 and RSA122 for receiving the data RDI0, RDIB0, RDI1 and RDIB1, respectively, which are to be repaired, from the data bus and amplifying the same in accordance with a control of the drains of the NMOS transistors NM121 and NM122.

Assuming that the repair control circuit according to the present invention is a repair control circuit which processes 8-bit input/output data, the operation in the case that there is a cell to be repaired will now be explained with reference to the accompanying drawings.

Figure 13A:
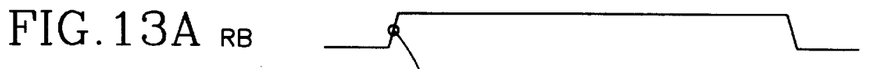
FIGS. 13A through 13H are waveform diagrams illustrating operational time of the circuit of FIG. 8.
Figure 13B:
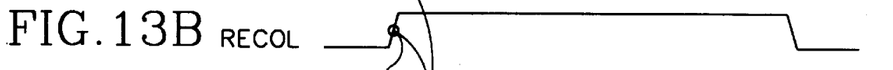

First, the column coding controller 10 outputs a column coding signal RECOL, shown in FIG. 13B, to the input/output repair controllers 30-j.

The block repair controller 20 cuts the block fuse with respect to the cell to be repaired and outputs a block repair signal RB which is enabled at a high level as shown in FIG. 13A.

Figure 13C:
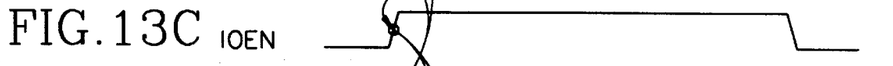
Figure 13D:
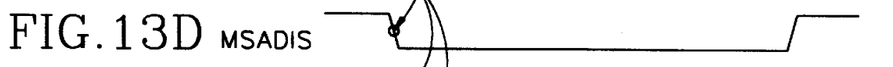
Figure 13E:
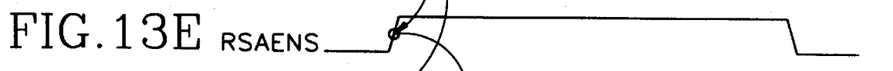

The appropriate input/output repair controller, e.g., 30-1, cuts an input/output fuse IOF91 with respect to the cell to be repaired, and a high level repair input/output signal RIO0 is generated by the resistor R91, the PMOS transistors PM91 and PM92 and the inverter INV91, and the repair input/output signal RIO0 and the block repair control signal RB are NANDed by the NAND-gate ND91 and are sequentially inverted for thereby outputting a main sense amplifier disable signal MSADIS as shown in FIG. 13D. In addition, the column coding signal RECOL and the repair input/output signal RIO0 are NANDed by the NAND-gate ND92 and are inverted by the inverter INV94 for thereby outputting an input/output control signal IOEN0 as shown in FIG. 13C. The inverted output signal from the NAND-gate ND91 is transmitted by the transmitting gate TG91 in accordance with a control of the output signal from the NAND-gate ND92 and the inverted signal and a repair sense amplifier enable signal RSAEN0 as shown in FIG. 13E is outputted.

Figure 13F:
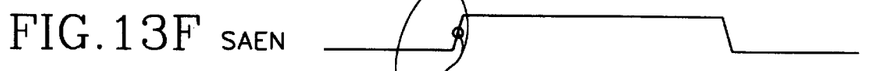
Figure 13G:
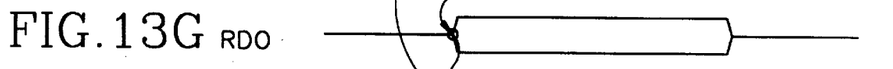

The main sense amplifier disable signal MSADIS is inputted into the main sense amplifier 40 with respect to the cell which is to be repaired for thereby disabling the main sense amplifier. The repair sense amplifier enable signal RSAEN and the sense amplifier enable signal SAEN as shown in FIG. 13F are inputted into the repair sense amplifier 50 for thereby enabling the repair sense amplifiers RSA121 and RSA122, so that the input/output data RDI0, RDIB0, RDI1 and RDIB1, which are to be repaired, are amplified and then outputted to the multiplexers 60-j.

Figure 13H:
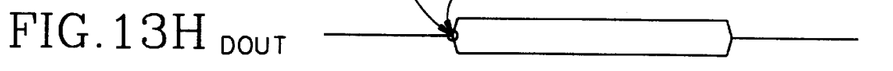

When the amplified output data RDO0 and RDO1 are inputted into the multiplexers 60-j, the transmission gates of the multiplexers 60-j are controlled by the input/output enable signals IOENi from the input/output repair controllers 30-j, and the amplified and repaired output data RDO0 and RDO1 are transmitted, so that the output data DOUT0 and DOUT1 as shown in FIG. 13H are outputted.

In the present invention, if there is a cell to be repaired, it is possible to reduce the fuse cutting time and the chip size by generating and using a control signal without blowing a fuse to disable the main sense amplifier with respect to the cell which is to be repaired.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A repair control circuit comprising:
    a column coding controller for outputting a column coding signal;
    a block repair controller for outputting a block repair signal;
    a plurality of input/output repair controllers for receiving the column coding signal and the block repair signal and outputting main sense amplifier disable signals, input/output repair control signals, input/output enable signals and a repair sense amplifier enable signals;
    a plurality of main sense amplifiers, corresponding in number to said plurality of repair controllers, for receiving and amplifying data from a data bus in accordance with main sense amplifier disable signals and sense amplifier enable signals, respectively;
    a repair sense amplifier for receiving and amplifying data, which is to be repaired, from the data bus in accordance with an input/output repair control signal, the repair sense amplifier enable signals and a sense amplifier enable signal; and
    a plurality of multiplexers, corresponding in number to said plurality of main sense amplifiers, for selectively outputting the amplified data from the main sense amplifier and the repair sense amplifier.

2. The circuit of claim 1, wherein a corresponding one of said input/output repair controllers generates a signal to disable a cell to be repaired, and further comprising a combining circuit for generating a combined signal for enabling the repair sense amplifier.

3. The circuit of claim 2, wherein each of said repair input/output controller has a logic circuit that includes:
    a first NAND-gate for receiving an input/output cutting signal and a block repair control signal;
    first and second inverters for sequentially inverting an output signal from the first NAND-gate and outputting a main sense amplifier disable signal;
    a second NAND-gate for receiving said input/output cutting signal and said column coding signal to produce a repair sense amplifier enable signal;

a third inverter for inverting an output signal from the second NAND-gate to produce an input/output enable signal;

a fourth inverter for inverting an output signal from the first NAND-gate; and a transmission gate for transmitting the inverted signal from said fourth inverter as said repair sense amplifier enable signal in accordance with an output signal from the second NAND-gate and an inverted version thereof.

4. The circuit of claim 2, wherein said combining circuit is operable to combine the input/output control signals from the plurality of input/output repair controllers to produce said combined signal.

5. The circuit of claim 4, wherein said combining circuit includes:

a plurality of NOR-gates for receiving said repair input/output control signals; and a NAND-gate for receiving output signals from the NOR-gates and producing said repair input/output combining signal.

6. The circuit of claim 2, wherein the repair sense amplifier enable signals from the input/output repair controllers are combined by a combination circuit such that a combination signal is outputted to the repair sense amplifier.

7. The circuit of claim 6, wherein said combination circuit includes:

a plurality of NOR-gates for receiving a plurality of repair sense amplifier enable signals; and a NAND-gate for receiving output signals from the NOR-gates and producing signal combination signal.

8. The circuit of claim 6, wherein said repair sense amplifier includes:

a NAND-gate for receiving the repair sense amplifier enable signal and the sense amplifier enable signal and producing a NANDed signal;

an inverter for inverting said NANDed signal; and a PMOS transistor a source of which receives an external voltage, a gate of which receives the combination signal from said combination circuit, and a drain of which is connected with an output terminal of the NAND-gate.

* * * * *